United States Patent [19]

Feng et al.

[11] 4,029,562

[45] June 14, 1977

[54] FORMING FEEDTHROUGH CONNECTIONS FOR MULTI-LEVEL INTERCONNECTIONS METALLURGY SYSTEMS

[75] Inventors: Bai-Cwo Feng; John S. Lechaton, both of Wappingers Falls, N.Y.

[73] Assignee: IBM Corporation, Armonk, N.Y.

[22] Filed: Apr. 29, 1976

[21] Appl. No.: 681,367

[52] U.S. Cl. .................. 204/192 EC; 156/656; 156/659
[51] Int. Cl.² ........................................ C23C 15/00
[58] Field of Search ............... 204/192 E, 192 EC; 156/3, 7, 8, 17

[56] References Cited

UNITED STATES PATENTS

| | | | |
|---|---|---|---|
| 3,661,761 | 5/1972 | Koenig | 204/298 |
| 3,804,738 | 4/1974 | Lechaton et al. | 204/192 |
| 3,873,361 | 3/1975 | Franco et al. | 204/192 X |

OTHER PUBLICATIONS

Obilous et al., "Multilevel Wiring for Integrated Circuits," *IBM Tech. Disc. Bull.*, vol. 13, No. 2, July 1970, pp. 429–430.

*Primary Examiner*—John H. Mack
*Assistant Examiner*—Aaron Weisstuch

[57] ABSTRACT

A method for forming feedthrough connections, or via studs, between levels of metallization atop semiconductor substrates. A first level conductive pattern is formed atop the substrate. A feedthrough pattern is then formed atop the first conductive pattern, the feedthrough pattern including one or more metal studs and a second, expendable material disposed on the studs. The formation of the feedthrough pattern is preferably accomplished by a lift-off process. The expendable material is removable by an etchant which does not substantially attack either the metal or the substrate. An insulator is deposited atop the substrate and the pattern by RF sputtering at a bias which is sufficiently high to cause substantial reemission of the insulator, thereby covering the exposed substrate surfaces and the expendable material but leaving the side surfaces of the material exposed. The expendable material is then etched with said etchant, thereby removing the second material and the portion of the insulator disposed thereon. A second conductive pattern may then be formed atop the insulator and selectively connected to the feedthroughs which thereby provide the interconnection between the first and second levels.

6 Claims, 7 Drawing Figures

FORMING FEEDTHROUGH CONNECTIONS FOR MULTI-LEVEL INTERCONNECTIONS METALLURGY SYSTEMS

CROSS REFERENCE TO A RELATED APPLICATION

This application is related to copending application of J. Havas et al., Ser. No. 681,380, filed Apr. 29, 1976 and assigned to the assignee of the present invention.

BACKGROUND OF THE INVENTION

1. Field of the Invention

This invention relates to the fabrication of semiconductor devices. More particularly, it relates to the fabrication of interconnection metallurgy systems atop the semiconductor devices.

2. Description of the Prior Art

Advances in modern semiconductor device technology have allowed increasing numbers of devices and circuits to be fabricated within a single semiconductor chip. This has required increasing microminiaturization of semiconductor elements as well as the interconnection metallurgy system connecting the elements within the chip into circuits. Such miniaturization results in decreased costs and improved performance in integrated circuits but is constantly crowding the fabrication technology, particularly the photolithographic and etching techniques of the interconnection metallurgy.

In integrated circuit logic design, for example, thousands of impurity regions are conventionally fabricated in a silicon chip, approximately 125-200 mils squared. Such regions form transistors, diodes, resistors and the like which are then connected together by wiring patterns atop the chip to form various circuits and f or connection to input-output terminals.

This interconnection metallurgy system atop the chip is extremely complex and usually employs two or three separate levels of complex conductive patterns, each separated by one or more layers of dielectric material. Ordinarily, the first level conductive pattern on the chip surface interconnects the transistors, resistors, diodes, etc. into circuits and also provides for circuit-to-circuit connections. The latter function is usually provided by parallel lines connected to the individual circuits. The second level conductive pattern conventionally completes the circuit-to-circuit connections and makes contact to I/O terminals which are connectable to a support such as a module, substrate or card. The second level usually consists of parallel lines that are transverse to the aforementioned parallel lines of the underlying first level conductive pattern.

Alternatively, a third level may be required for power and I/O connections.

The area occupied within the semiconductor chip by the active and passive semiconductor devices utilized in the various circuits actually occupies a small amount of the total area of the chip. The support area for the metallurgy is the primary factor in determining its size.

At the present state of technology, the lower limits of the width of an interconnection metallurgy stripe are thought to be imposed primarily by photolithographic technology. The line widths are in the order of 0.15 mils with a separation on the order of 0.15 mils for long lines. However, a more severe restriction exists using conventional techniques to form multi-level conductive patterns. At present it is necessary to etch the dielectric layers to form feedthrough patterns from one level to another. Most commonly, after the etching process, the second metallurgy layer is deposited over the dielectric layer and into the via holes to contact the first metallurgy layer.

However, overetching of one dielectric layer due to, say, mask misalignment may result in the etching of a lower dielectric layer. To compensate for such a contingency, it is common to provide increased areas of metallurgy, termed pads, at via hole sites. These pads do effectively prevent overetching but also substantially increase the chip area required for interconnection metallurgy.

One solution to this problem is found in U.S. Pat. No. 3,844,831 issued in the names of E. E. Cass et al., and assigned to the same assignee as the present invention. The Cass et al., technique involves the use of dielectric layers of dissimilar etching characteristics, whereby an etchant which attacks one type of dielectric does not substantially affect the other.

Although the Cass et al., invention has been successful, dielectric etching still is recognized as causing shorts, pinholes and contamination, no matter how controlled the process.

It is therefore desirable to be able to form interconnections between levels of metallurgy without the necessity of etching the dielectric layer.

SUMMARY OF THE INVENTION

Accordingly, it is a primary object of our invention to form interconnections between levels of metallurgy without the necessity for etching dielectric layers.

It is another object of our invention to provide improved techniques for reducing the area required for wiring patterns atop semiconductor chips.

These and other objects of our invention are achieved by forming feedthroughs atop a conductive film pattern on a substrate; the feedthrough pattern includes a conventional functional metal and a cap of second, expandable material, which is preferably also metal. The pattern is preferably formed by a lift-off process such as that described in the patent to Franco et al entitled "Method of Depositing Thin Film Using a Lift-Off Mask", U.S. Pat. No. 3,873,361 and assigned to the assignee of the present invention. The expendable material is selected so that it can be removed by an etchant which does not attack the conductive film or the substrate.

In one preferred embodiment the metallic stripes comprising said conductive film pattern and the functional feedthrough metal may be either aluminum, copper-doped aluminum or copper-doped aluminum with silicon added. The expendable material is preferably copper or chrome or a composite of chrome-copper-chrome. The substrate is typically silicon dioxide, silicon nitride or a composite thereof.

An insulator, preferably silicon dioxide, is then deposited atop both the substrate and also the patterns by RF sputtering at a bias which is sufficiently high to cause substantial reemission of the insulator. This results in the covering of the exposed substrate and thin film surfaces as well as the expendable material with the insulator but leaves the side surfaces of the material exposed. The expendable material is then chemically etched so as to lift-off both the material as well as the silicon dioxide deposited thereon, thereby leaving a completely insulated first level conductive film pattern and exposed feedthroughs. A second level conductive film pattern may then be deposited atop the insulator which is connected to the first level by the feedthroughs.

The process is extendible to multiple levels of conductive patterns.

DESCRIPTION OF THE PREFERRED EMBODIMENT

Figure 1:
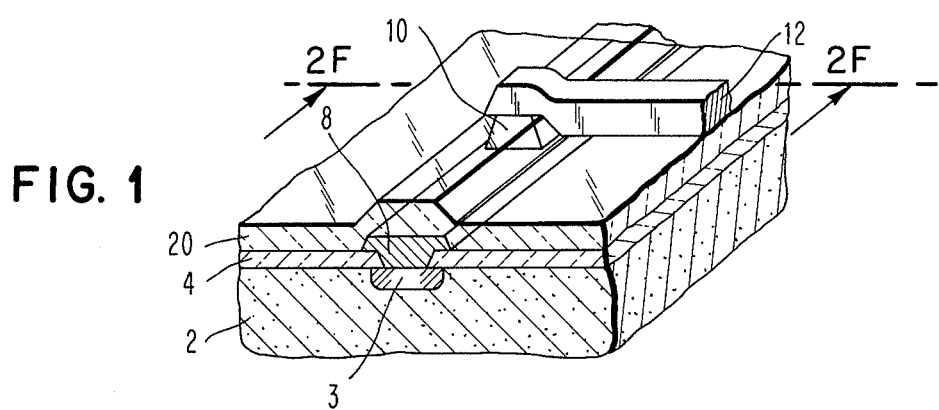
FIG. 1 is a partially sectioned, perspective view of a portion of an integrated circuit fabricated in accordance with our invention.

In FIG. 1, there is shown a first level metal stripe 8 which is connected through a dielectric layer 4 to an impurity region 3 in a semiconductor substrate 2. Film 8 represents a portion of a complex conductive pattern atop chip 2 and is illustrated as being relatively elongated for connection to a second level of metallization 12 as well as to other films (not shown) on the first level. A feedthrough, or via stud, 10 interconnects film 12 and film 8 through a dielectric layer 20. Layer 20 is preferably silicon dioxide. The process for forming this type of interconnection is described with respect to FIGS. 2A–2F.

Throughout the specification, for purposes of clarity and conciseness, the conductive pattern which remains as part of the metallization system is termed "functional metal" and the material deposited atop the functional metal and subsequently removed is termed "working metal" or "cap". Broadly expressed however, the functional metal may be any electrically conductive material; the cap is a material which may be removed without substantially affecting the functional metal or the substrate disposed thereunder. Due to the high temperatures involved in RF sputtering, metal is more suitable as the expendable material than an organic or an inorganic dielectric. However, our invention is not to be construed as limited to metals. The substrate may be a semiconductor material such as silicon or a semiconductor substrate having a surface layer of an electrically insulative material, such as silicon dioxide, silicon nitride or a composite of silicon dioxide and silicon nitride.

Figure 2A:
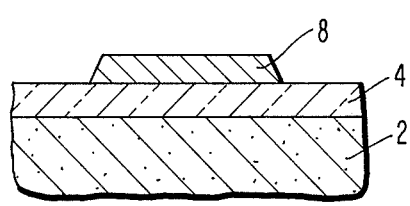
FIGS. 2A–2F are diagrammatic cross-sectional views of a structure being fabricated in accordance with the preferred embodiment of our invention.

Turning now to the process, FIG. 2A shows a cross-section of thin metallic film 8 disposed atop insulative substrate 4. As previously noted, film 8 comprises a portion of a first level conductive pattern which is generally interconnected through substrate 4 to a doped impurity region or regions within a semiconductor substrate (not shown). Film 8 is also interconnected to other such films on the same level to form device-to-device and circuit-to-circuit interconnections, as is well known in the art.

One technique for depositing thin film 8 on substrate 4 corresponds to the basic method described in U.S. Pat. No. 3,873,361 entitled "Method of Depositing Thin Film Utilizing A Lift-Off Mask" in the names of Franco et al.. Other techniques could be used as well. For example, the technique described in the application of Franco et al., Ser. No. 576,054 filed May 9, 1975 entitled "A Method for Forming Patterned Films Utilizing a Transparent Lift-Off Mask" or the technique described in application Ser. No. 448,327, filed Mar. 5, 1974 in the names of Feng et al., now U.S. Pat. No. 3,982,943, entitled "A Lift-Off Method Of Fabricating Thin Films In A Structure Utilizable As A Lift-Off Mask" could be used. Each of these applications is assigned to the assignee of the present invention.

Our preferred lift-off process is that described in the copending application of J. R. Franco et al., Ser. No. 576,054 filed May 9, 1975 and entitled "A Method For Forming Patterned Films Utilizing A Transparent Lift-Off Mask". Briefly this method comprises the deposition of a first organic polymeric masking layer on substrate 4 which is then baked to improve adhesion and thermal stability. A polydimethylsiloxane resin layer having a preponderence of SI—O bonds relative to Si—CH$_3$ bonds is spun-on over the polymeric layer. A second masking layer, which may be photoresist or an electron-beam resist, is placed on the resin layer. The second masking layer is patterned using standard photo-or electron-beam lithographic techniques to expose portions of the resin layer in the desired pattern. Using the patterned second masking layer as a mask, openings are reactively-sputter-etched in the resin layer using a fluorine gas ambient. Then, conforming openings are made in the first masking layer by a second reactive sputter etching step in the same sputtering chamber using a oxygen gas ambient instead of the fluorine gas ambient. Thin metallic film 8 is then blanket-deposited atop the resin and in the first masking layer openings atop substrate 4. The first masking layer is then removed, causing that portion of the thin film atop the resin to be lifted off. Overetching of the first masking layer produces an overhang of the openings in the overlying polydimethysiloxane resin layer which facilitates easy lift-off of the unwanted portions of the finally-deposited thin film 8.

Other techniques besides lift-off could be used to arrive at the structure of FIG. 2A. For example, standard reactive ion etching or sputter etching techniques might also be used, although they are less feasible at the present time. Such techniques generally comprise depositing blanket layers of the metal film 8 atop substrate 4, applying an appropriate photoresist, developing the photoresist as a mask for the desire pattern and removing the unwanted metal by reactive ion etching or sputter etching where the photoresist has been removed.

Figure 2B:
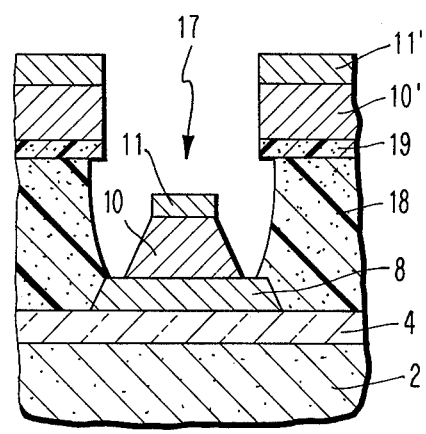

The formation of feedthrough 10 is illustrated in FIGS. 2B to 2E. In FIG. 2B, the lift-off process previously described with particular reference to the Franco et al., patent application Ser. No. 576,054 is used to form a composite of feedthrough 10 and working metal cap 11 atop first metal film 8.

In the preferred process, organic polymeric masking layer 18 is deposited atop substrate 4 and metal film 8. After baking, polydimethylsiloxane resin 19 is spun on over layer 18. A second masking layer, not shown, is deposited atop resin 19 and patterned to expose portions of resin 19 to be used for the feedthrough locations. Using the patterned second masking layer as a mask, openings respectively, are reactively etched in resin 19 using a fluorine gas ambient. Conforming openings are then made in masking layer 18 by a second reactive etching step using an oxygen gas ambient instead of fluorine.

Next, using the lift-off composite structure 19/18, metallic films 10' and 11', which are used to form the functional metallic feedthroughs and caps, are blanket-deposited over the structure. Feedthrough 10 is preferably aluminum, aluminum-copper alloys or aluminumcopper-silicon; cap 11 is preferably a composite of chrome-copper-chrome, although it may comprise a single copper layer. An initial layer of chrome is typically deposited to a thickness of around 500A to act as a barrier to the alloying of the copper and aluminum. A chrome layer disposed atop the copper layer protects the copper from attack by the etchant used subsequently to remove layer 18.

Besides the particular metals discussed, a composite of chrome-silver-chrome or tantalum-gold-tantalum could be used in place of the aluminum feedthrough, with aluminum acting as the expendable cap rather than chrome-copper-chrome.

Figure 2C:
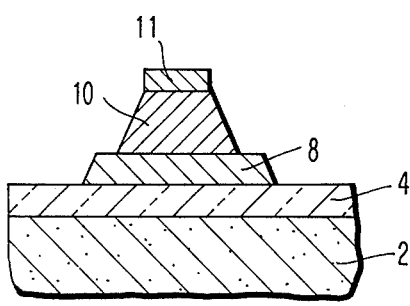

Finally, utilizing conventional lift-off removal techniques, photoresist layer 18 is completely removed by immersion into a solvent, such as N-methyl pyrrolidone standard photoresist solvent, for about 15 to 30 minutes, which leaves thin film composite 8/10/11 in the desired pattern configuration of FIG. 2C. The solvent selected should be one which dissolves or swells the polymeric material of layer 18 without affecting the thin film. Such solvents include acetone, isopropanol, methyl ethyl ketone or trichloroethylene.

Figure 2D:
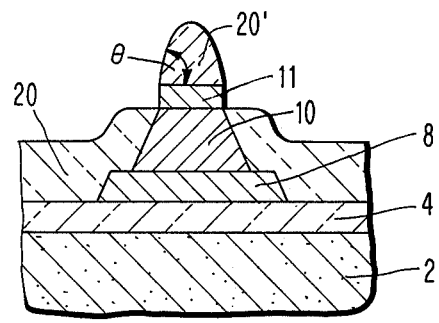

FIG. 2D illustrates a critical step in our process. Insulator 20 is sputter-deposited in blanket fashion atop substrate 2 and metal layer 11. The insulator, which is preferably glass, is deposited by RF sputtering at a bias which is sufficiently high to cause substantial reemission of insulator 20. As shown in FIG. 2D, this results in the covering of the exposed substrate surfaces and layer 11, but leaving the side surfaces of layer 11 uncovered.

The RF sputtering apparatus to accomplish this is well known in the art and has been described in the publication "Power Networks For Substrates", R. P. Auyang et al, IBM Technical Disclosure Bulletin, September 1971, page 1032. The system has also been described in the patent issued in the name of J. F. Lechaton et al., U.S. Pat. No. 3,804,728 and assigned to the assignee of the present application.

Using this type of RF sputtering system, glass 20, having the configuration illustrated in FIG. 2D, is deposited by supplying a total power of 3000 watts to the RF sputtering system. The anode power on which the substrate is disposed receives a power input of 500 watts; the target electrode of silicon dioxide material to be deposited receives an input power of 2500 watts. The edges of layer 11 are kept clear when the angle $\theta$ of glass layer 20' to the horizontal is 31° or less. The reemission coefficient of the sputtered material during the deposition process is typically around 0.60 or greater.

In practice, feedthrough 10 must be as thick as the RF sputtered glass 20 to ensure that cap 11 remains exposed. Moreover, the thickness of feedthrough 10 must be sufficient to ensure the adequate coverage of metal 8 by glass 20. In practice, then, if metal 8 is 1 micron thick, glass 20 and stud 10 must be around 2 microns thick.

The importance of maintaining the sides of the functional material 14 free of glass cannot be overemphasized. Our process is ineffective if there is any significant quantity of glass adhering to the sides of material 11.

However, if small quantities of glass did remain on the side surfaces of cap 11, the former could be removed by a dip into buffered HF for a short period. This would be sufficient to clean the side surfaces of cap 11 but would not significantly affect layer 20.

Figure 2E:
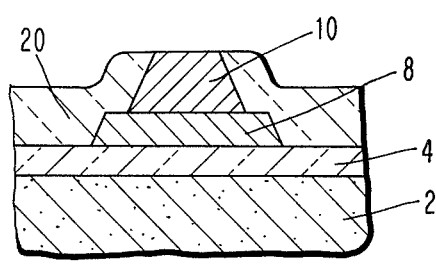

In FIG. 2E the first level metal 8 and feedthrough 10 is shown after the working material 11 is removed. The etchant used to remove chrome-copper-chrome cap 11 is preferably concentrated nitric acid, which does not substantially attack either aluminum, silicon nitride or glass. If aluminum were used as cap 11 and chrome-silver-chrome or tantalum-gold-tantalum comprised metal 10, potassium hydroxide solution would be used as the etchant.

Figure 2F:
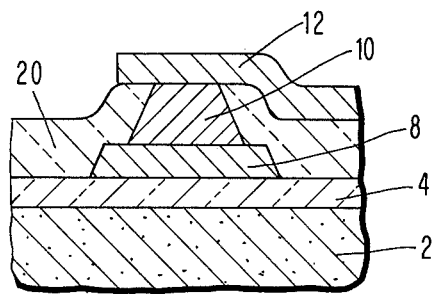

FIG. 2F illustrates the structure wherein a second level of wiring 12 is deposited atop feedthrough 10 to complete a two level pattern.

Although the invention has been particularly shown and described with reference to the preferred embodiments thereof, it will be understood by those skilled in the art that the foregoing and other changes in form and details may be made therein without departing from the spirit and scope of the invention.

We claim:
1. A method for forming connections between levels of conductive patterns comprising:
   forming a first conductive pattern atop a substrate;
   forming another pattern atop selected portions of said first conductive pattern, said other pattern including a first metal and an expendable material disposed on said first metal;
   said expendable material being removable by an etchant which does not attack said metal or said substrate;
   depositing an insulator atop said substrate and said patterns by RF sputtering at a bias which is sufficiently high to cause substantial reemission of said insulator, thereby covering the exposed substrate surfaces and said patterns, but leaving the side surfaces of said expendable material exposed;
   etching said expendable material with said etchant, thereby removing said expendable material and the portion of the insulator disposed thereon.

2. A method as in claim 1 wherein said first metal is selected from the group consisting of aluminum, aluminum-copper alloys and aluminum-copper-silicon alloys.

3. A method as in claim 2 wherein said expendable material is selected from the group consisting of copper and chrome-copper-chrome composites; and
   said etchant is nitric acid.

4. A method as in claim 1 wherein said first metal is selected from the group consisting of chrome-silver-chrome composites and tantalum-gold-tantalum composites.

5. A method as in claim 4 wherein said expendable material is aluminum; and
   said etchant is potassium hydroxide solution.

6. A method as in claim 1 further comprising:
   forming a second conductive pattern atop said insulator in contact with said other pattern, said other pattern thereby acting as a feedthrough between said first and second conductive patterns.

* * * * *